United States Patent
Kikuchi et al.

(10) Patent No.: US 6,903,400 B2
(45) Date of Patent: Jun. 7, 2005

(54) MAGNETORESISTIVE MEMORY APPARATUS

(75) Inventors: Hideyuki Kikuchi, Kawasaki (JP); Masashige Sato, Kawasaki (JP); Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/788,319

(22) Filed: Mar. 1, 2004

(65) Prior Publication Data

US 2005/0072997 A1 Apr. 7, 2005

(30) Foreign Application Priority Data

Oct. 6, 2003 (JP) ....................................... 2003-346616

(51) Int. Cl.⁷ .............................................. H01L 29/76
(52) U.S. Cl. ...................... 257/295; 257/298; 257/303; 257/306; 257/324; 438/3; 438/240
(58) Field of Search ................... 257/68, 71, 295–314, 257/324–326; 438/3, 240

(56) References Cited

U.S. PATENT DOCUMENTS 6,518,588 B1 * 2/2003 Parkin et al. .................. 257/3
6,552,926 B2 * 4/2003 Komori ...................... 365/158

FOREIGN PATENT DOCUMENTS

| JP | 2002-217382 | 8/2002 |
| JP | 2002-299584 | 10/2002 |
| JP | 2002-367365 | 12/2002 |

* cited by examiner

Primary Examiner—Andy Huynh
(74) Attorney, Agent, or Firm—Armstrong, Kratz, Quintos, Hanson & Brooks, LLP

(57) ABSTRACT

A magnetoresistive memory apparatus with a semiconductor substrate having a plurality of intersecting, non-contacting word lines and bit lines constituting a matrix, and a plurality of ferromagnetic tunnel junction devices located adjacent each intersection of the plurality of lines, each junction device having, disposed one upon another via insulating layers, free layers having variable magnetization directions and fixed magnetization layers having fixed magnetization directions, with magnetized information being written to the memory device at an intersection selected by magnetization electric currents supplied to the lines, the magnetized information read out by detecting the resistance variance of electric currents flowing through the memory device due to the tunnel effect. The plurality of junction devices deviate from the intersections of the plurality of lines, and between the lines are non-contacting free layer extended portions being extensions from only the free layer, to shorten the interval there between.

8 Claims, 16 Drawing Sheets

MAGNETORESISTIVE MEMORY APPARATUS

BACKGROUND OF THE INVENTION

1. Field of the Invention

The present invention relates generally to a magnetoresistive memory apparatus which records and regenerates magnetic information using a ferromagnetic tunnel junction (MTJ) device and, more particularly, to a magnetoresistive memory apparatus which can record magnetized information with magnetization inversion by small recording currents.

2. Description of the Related Arts

Traditionally, magnetoresistive memory (MRAM) has been attract attention as a memory apparatus which does not lose information after cutting the power supply and has no limitation on the number of reading and writing. Magnetoresistive memory is nonvolatile memory which has a degree of integration and high speed comparable to DRAM and can be rewritten without limitation, and is achieved by combining magnetic tunnel junction (MTJ) devices and MOS technology.

FIG. 1 is a circuit diagram of one (1) cell of magnetoresistive memory which consists of one (1) transistor and one (1) cell, and FIG. 2 shows a cross sectional view of a magnetoresistive memory cell. In a cell circuit of FIG. 1, a magnetoresistive memory cell consists of a magnetic tunnel junction device 100 and a MOS field-effect transistor 102; the magnetic tunnel junction device 100 is connected between a bit line 104 and a source S of the MOS field-effect transistor 102; a drain is connected to a plate line 106; and a gate G is connected to a read word line 108. In a cross section of the memory cell of FIG. 2, n channel layers 112 and 114, as well as a source electrode 116, a drain electrode 118 and the read word line 108 as a gate electrode are formed on a p channel semiconductor substrate 110.

As shown in FIG. 3, in the magnetic tunnel junction device 100, a ferromagnetic free layer 120 which has variable magnetization direction and ferromagnetic free layers 124 which has fixed magnetization direction is laminated via an insulating layer (Al—O layer) 122, and in a fixed magnetization layers 124, a anti-ferromagnetic pin layer 128 which is in exchange coupling with a ferromagnetic pinned layer 126 is laminated. To an inter-layer insulating film 130 formed on the semiconductor substrate 110 of FIG. 2, a plurality of bit lines 104 and read word lines 132 which intersect to constitute a matrix without contact are provided, and the magnetic tunnel junction device 100 which has a structure of FIG. 3 is located in a intersection between the bit lines 104 and the read word lines 132. This magnetic tunnel junction device 100 connects its free layer 120 side to the bit lines 104 and the pin layer 128 side to the source electrode 116 via an electric conductor 134. In such magnetoresistive memory, reading and writing are performed according to a following procedure.

(1) Writing

In the writing of magnetized information into the magnetic tunnel junction device 100 of the magnetoresistive memory, as shown in FIG. 4, by simultaneously sending currents Iy and Ix to the bit line 104 and the read word line 132 which are orthogonal above and under the magnetic tunnel junction device 100 and generating magnetic fields Hy and Hx, the magnetized information are written selectively. In this case, if the current is send to only one line of the bit line 104 and the read word line 132, the writing will not be performed. The free layer 120 acting as a write layer of the magnetic tunnel junction device 100, which is used as a memory device, is rectangular such that magnetic anisotropy (anisotropic magnetic field) is generated. In the magnetization direction of the free layer 120, the longitudinal direction of the rectangle is a stable direction, or an easy direction, because of its magnetic anisotropy. Therefore, magnetization in the stable direction is stable as long as an external magnetic field (switching magnetic field), which is necessary for reversal of the magnetization direction, is applied to it. Bits are set to "0" or "1" according to the magnetization direction in this free layer 120. As a method for selectively reversing the magnetization direction of the magnetic tunnel junction device 100, there is a method which applies the magnetic field Hy to a latitudinal direction, or a hard direction of the free layer 120 which is rectangular and simultaneously applies the magnetic field Hx to the easy direction. In other words, as shown in FIG. 4, by applying the magnetic field Hy to the hard direction of the free layer 120 with the write current Iy of the write word line 132, an energy barrier necessary for rotation of the magnetization direction may be lowered. At this point of time, if the magnetic field Hx is simultaneously applied to the easy direction of the free layer 126 with the write current Ix of the bit line 104, the magnetization direction of the free layer 120 of the magnetic tunnel junction device only, which is located in a current intersection, is turned to the easy direction which is the same as the magnetic field Hx.

FIG. 5 illustrates an asteroid curve which is thresholds of magnetic writing in the case that the easy directional magnetic field Hx and the hard directional magnetic field Hy are applied to the free layer. It is noted that the easy directional magnetic field Hx and the hard directional magnetic field Hy are normalized by the magnetic anisotropy (anisotropic magnetic field) Hk. This asteroid curve may be represented by following equation.

$$Hx^{2/3}+Hy^{2/3}=Hk^{2/3}$$

The setting of a bit 0 or 1 according to the recording direction of the magnetized information is performed with combinations exceeding the thresholds given by the asteroid curve. For example, bit 1, 0 is set by recording a magnetization direction according to a combination of the easy directional magnetic field and the hard directional magnetic field of a point P1 located outside of the thresholds (Hx1/Hk, Hy1/Hk) and recording a turned magnetization direction according to a combination of the easy directional magnetic field and the hard directional magnetic field of a point P2 also located outside of the thresholds (−Hx1/Hk, Hy1/Hk).

(2) Reading

When the magnetic tunnel junction device 100 is selected by applying voltage to the bit line 104 and the read word line 108 of FIG. 1 and MOS field-effect transistor 102 is turned on, a current path through the magnetic tunnel junction device 100 is formed, and resistance is read. At this point, in the case that the magnetization direction of the free layer 120 of the magnetic tunnel junction device 100 is reversed by ferromagnetic tunnel effect, a resistance difference will be about 30 to 50%.

(3) Ferromagnetic Tunnel Effect

Generally, in a junction which has a "metal-insulator-metal" structure in semiconductor, when voltage is applied between the metals on both sides, if the insulator is substantially thin, an electric current flows slightly. Generally, an insulator does not conduct electricity, but if it has a thickness from several angstroms to several tens of angstroms which is substantially thin, it has probability to transmit just a few electrons due to quantum-mechanical effect, an electric current flows slightly. This current is called a "tunnel current", and a junction which has this structure is called a "tunnel junction". For the insulating layer 122 of the magnetic tunnel junction device 100, a metal oxide film is typically used as an insulating barrier. For example, a surface layer of aluminum is oxidized by natural oxidation, plasma oxidation and thermal oxidation. By adjusting oxidation conditions, it is possible to make several angstroms to several tens of angstroms of the surface into an oxide film. Because aluminum oxide is an insulator, it can be used as a barrier layer of the tunnel junction. A characteristic of these tunnel junctions is that, unlike normal resistance, an electric current for applied voltage has non-linearity, so this is used as nonlinear device.

A structure in which metals on both sides of the tunnel junction are replaced by ferromagnetic metals is called a magnetic tunnel junction. In the magnetic tunnel junction, it is known that the tunnel probability (tunnel resistance) depends on the magnetization conditions of magnetization layers on both sides. In other words, the tunnel resistance can be controlled by magnetic fields. Assuming that a relative angle of magnetization is θ, the tunnel resistance R can be represented by:

$$R=Rs+0.5\Delta R(1-\cos\theta) \quad (1)$$

In other words, when angles of magnetization directions of the magnetization layers on both sides are the same (θ=0), the tunnel resistance becomes smaller(R=Rs), and when magnetization directions of the magnetization layers on both sides are opposite (θ=180), the tunnel resistance becomes larger (R=Rs+ΔR). This is caused by that electrons inside of the ferromagnetic material are polarized. Generally, in electrons, a up electron which is spinning upward and a down electron which is spinning downward are existed, and since the same numbers of both electrons are existed as electrons inside of normal nonmagnetic metals, it has no magnetization as a whole. On the other hand, in electrons inside of the ferromagnetic metals, the number of the up electrons (Nup) and the number of the down electrons (Ndown) are different, so it has magnetization depending on the up electrons or the down electrons. It is known that, if electrons tunnel, these electrons tunnel sustaining each spinning condition. Therefore, if there is vacancy in the electron condition of a destination of tunneling, tunneling is possible, but if there is no vacancy in the electron condition of a destination of tunneling, tunneling is not possible.

A change rate of the tunneling resistance is represented by a product of a polarization rate of a source of electrons and a polarization rate of a destination of tunneling.

$$\Delta R/Rs=2\times P1\times P2/(1-P1\times P2) \quad (2)$$

where P1 and P2 are polarization rates and represented by:

$$P=2(N\mathrm{up}-N\mathrm{down})/(N\mathrm{up}+N\mathrm{down}) \quad (3)$$

The polarization rate P depends on kinds of the ferromagnetic metals. For example, polarization rates of NiFe, Co and CoFe are 0.3, 0.34 and 0.46, respectively, and in these cases, in a theoretical sense, about 20%, 26% and 54% of magnetoresistive change rates (MR ratios) are expected, respectively. These values of MR ratios are greater than anisotropic magnetoresistive effect (AMR) and giant magnetoresistive effect (GMR) and possible to apply to magnetic sensors and magnetic heads. Also, the tunnel resistance R depends on an insulating barrier height φ and a width W, according to next equation.

$$R\infty\mathrm{Exp}\,(W\times(\phi)^{1/2}) \quad (4)$$

Therefore, the tunnel resistance R becomes small when the barrier height φ is low and the barrier width W is narrow.

FIG. 6 is a magnetoresistive effect curve (MR curve) of magnetoresistive tunnel junction which has such a spin-valve structure. Here, as a magnetoresistive tunnel junction of FIG. 7, if the structure consists of a pin layer 128 which is a anti-ferromagnetic layer, a pinned layer 126 which is a ferromagnetic layer, an insulating layer 122 and a free layer 120 which is a ferromagnetic layer, exchange coupling of CoFe layer which is the pinned layer 126 and Pt—Mn layer which is the pin layer 128 is formed, and the magnetization direction of the pinned layer 126 is fixed. Therefore, if a magnetic field is applied from outside, only the magnetization direction of the free layer 120, which is NiFe layer, is rotated. Then, because a relative angle of magnetization is changed between the free layer 120 and the pinned layer 126, the tunnel resistance R will be changed by resisting the magnetic field, as shown by equation (1) (See, e.g., Japan Patent Application Laid-open Pub. Nos. 2002-217382, 2002-299584 and 2002-367365).

By the way, if high-density memory is formed using magnetic tunnel junction devices, device sizes as well as wiring widths and pitches must be miniaturized. If the device size is miniaturized, holding power Hc of a free layer becomes greater, so a switching magnetic field applied to the free layer for reversing a magnetization direction must be increased. Increasing the switching magnetic field must involve increasing currents sent to a word line and a bit line for recording magnetized information. However, to increase currents, a size of a current drive circuit must be expanded, and this makes higher density difficult. Also, due to effects of both of the wiring miniaturization and the current increase, a density of currents increases and migrations are generated, resulting in problems such as disconnection.

SUMMARY OF THE INVENTION

According to the present invention there is provided a high-density, low power consumption magnetoresistive memory apparatus by reducing currents sent to wirings for writing magnetized information. The present invention is directed to a magnetoresistive memory apparatus having a semiconductor substrate on which are arranged a plurality of word lines and bit lines which intersect each other in a non-contact manner to constitute a matrix, and a plurality of magnetoresistive memory devices located in the vicinity of each of intersections of the plurality of bit lines and word lines, the magnetoresistive memory devices each consisting, disposed one upon another via insulating layers, of free layers having variable magnetization directions and of fixed magnetization layers having fixed magnetization directions, with magnetized information being written to the magnetoresistive memory device at an intersection selected by magnetization electric currents supplied to the bit lines and the word lines, the magnetized information being read out by detecting the resistance variance of electric currents flowing through the magnetoresistive memory device due to the tunnel effect.

In such a magnetoresistive memory apparatus of the present invention is characterized in that the plurality of magnetoresistive memory devices are located at positions deviating from the intersections of the plurality of word lines and bit lines, and that between the bit lines and the word lines at each of the intersections are disposed in a non-contact manner free layer extended portions which are extensions from only the free layer magnetic material of each magnetoresistive memory device. The magnetoresistive memory device is in the form of a bottom-type ferromagnetic tunnel junction which includes, laminated in sequence from the upper layer having the bit lines arranged thereon, the free layer provided with the free layer extended portion, the insulating layer and the fixed magnetization layer. The magnetoresistive memory device is in the form of a top-type ferromagnetic tunnel junction which includes, laminated in sequence inversely from the upper layer having the bit lines arranged thereon, the fixed magnetization layer, the insulating layer and the free layer provided with the free layer extended portion. The magnetoresistive memory device is located at a position deviated from the intersection, along the bit lines and toward the lower layer. In this case, when the magnetoresistive memory device includes the fixed magnetization layer, the insulating layer and the free layer provided with the free layer extended portion that are laminated in sequence from the upper layer having the bit lines arranged thereon, the bit lines are stepped at a position passing the magnetoresistive memory device in such a manner as to come closer to the free layer extended portions toward the intersections. The magnetoresistive memory device is located at a position deviated from the intersection and not overlapping the bit lines and the word lines, and an end of the free layer extended portion is slantly extended to the intersection.

The fixed magnetization layer of the magnetoresistive memory device includes, placed one on-top of the other, a ferromagnetic layer (pinned layer) and an anti-ferromagnetic layer (pin layer) which are exchange coupled with each other. The free layer and the free layer extended portion of the magnetoresistive memory device are made of an alloy of Ni and Fe, Co or an alloy of Co and Fe, the insulating layer is made of aluminum oxide, the ferromagnetic material layer (pinned layer) of the fixed magnetization layer is made of an alloy of Ni and Fe, Co or an alloy of Co and Fe, and the anti-ferromagnetic material layer (pin layer) is made of an alloy of Pt and Mn. In a magnetoresistive memory apparatus of the present invention, by extending a free layer which is a recording layer reversing a magnetic field in a magnetic tunnel junction device and inserting it between a word line and a bit line, a distance between a wiring and the free layer, for which an arrangement interval corresponding to a device laminated layer is traditionally needed, can be shortened, and by shortening the distance, a switching magnetic field efficiently act on the free layer, therefore the current sent to the wiring can be made smaller than conventional one. As a result, in the magnetoresistive memory apparatus, higher density and lower power consumption can be facilitated.

The above and other objects, features, and advantages of the present invention will become more apparent from the following detailed description with reference to the drawings.

DESCRIPTION OF THE PREFERRED EMBODIMENTS

Figure 8:
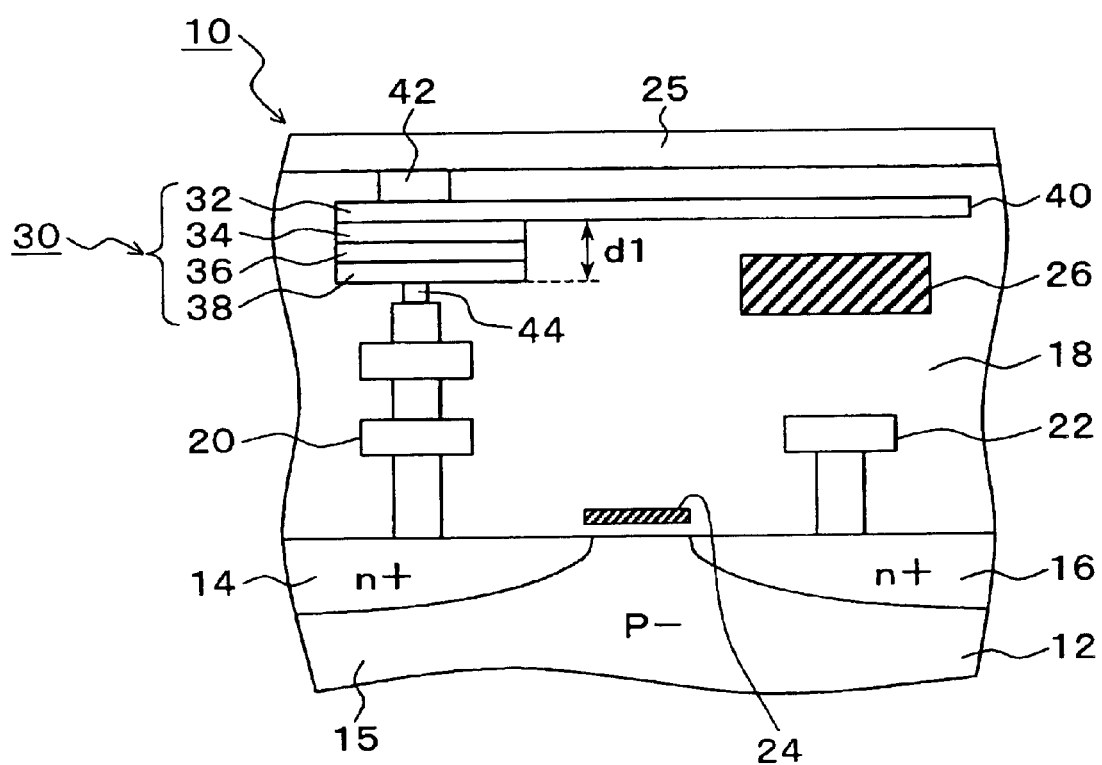
FIG. 8 is a cross sectional view illustrating an embodiment of a cell structure in a magnetoresistive memory apparatus of the present invention.

FIG. 8 is a cross sectional view illustrating an embodiment of a cell structure of one (1) cell in a magnetoresistive memory apparatus of the present invention. In FIG. 8, the magnetoresistive memory apparatus 10 of the present invention forms an inter-layer insulating film 18 on a semiconductor substrate 12 which is comprised of a source area 14, a gate area 15 and a drain area 16, and in this film, a memory device using a ferromagnetic tunnel junction device 30 is provided. In other words, to the source area 14 and the drain area 16 on the semiconductor substrate 12, electrodes are formed by embedding Cu or the like with formation of contact holes, and a read word line 24, which acts as a gate using Cu , is also provided in close vicinity to the gate area 15. To the upper part of the source electrode 20, a magnetic tunnel junction device (MTJ) 30 is provided via a conductor layer 44. To the upper part of the magnetic tunnel junction device 30, a bit line 25 is connected via a conductor layer 42. Also, On the side of the drain electrode 22 which is provided to the semiconductor substrate 12, a write word line 26 is provided in a direction orthogonal to the bit line 25. A plurality of the bit lines 25 and the write word lines 26 are provided such that these lines intersect to constitute a matrix without contact. In the magnetoresistive memory apparatus 10 of the present invention, the magnetic tunnel junction device 30 is not provided in a intersection between the bit lines 25 and the write word lines 26, and it is located at a position away from the intersection, which is, in this embodiment, a position along the bit line 25 located on the upper layer side and deviating from the intersection.

Figure 9:
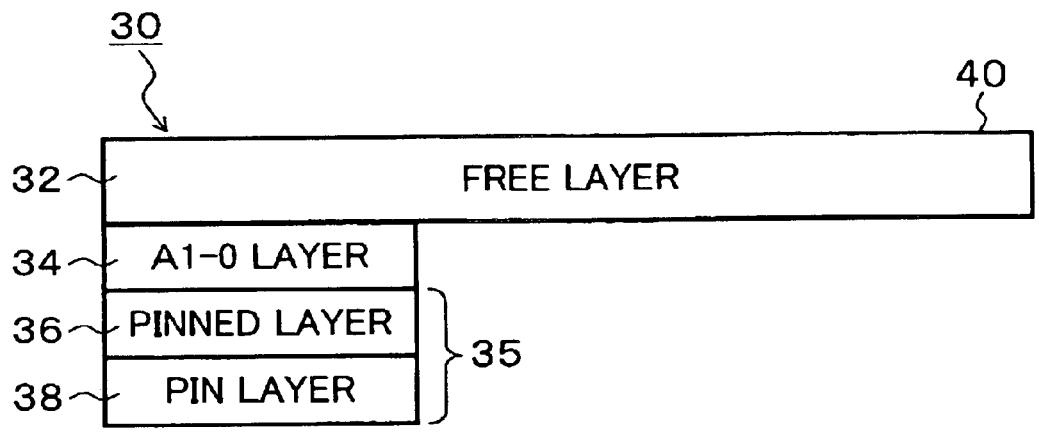
FIG. 9 is a structure explanatory diagram of the magnetic tunnel junction device (MTJ) used in FIG. 8.

As taken out and shown in FIG. 9, the magnetic tunnel junction device 30 are structured by sequentially laminating a free layer 32, an insulating layer (Al—O layer) 34, a pinned layer 36 and a pin layer 38. The free layer 32 is a ferromagnetic material used as a recording layer, in which magnetization directions are variable and, for example, an alloy of Ni and Fe is used. The insulating layer 34 has a thickness of several angstroms and acts as a tunnel barrier layer, and aluminum oxide Al—O is used. The laminated portion of the pinned layer 36 and the pin layer 38 is a fixed magnetization layer 35, in which the magnetization direction is fixed, and a magnetic tunnel junction film is constructed by positioning this to the free layer 32, in which magnetization directions are variable, via the insulating layer 34. The pinned layer 36 is a ferromagnetic material layer, and for example, an alloy of Co, Fe and others are used. The pin layer 38 is an anti-ferromagnetic material layer for which an alloy of Pt, Mn and others are used and fixes the magnetization direction of the pinned layer 36 by forming exchange coupling with the pinned layer 36. In the magnetic tunnel junction device 30 of the present invention, in MTJ film which consists of the free layer 32, the insulating layer 34, pinned layer 36 and pin layer 38, by extending the free layer 32 which acts as a recording layer and has variable magnetization directions toward the longitudinal direction, a free layer extended portion 40 is integrally formed. The magnetic tunnel junction device 30 of the present invention comprising the free layer extended portion 40 is wherein it is located at the position which is deviated from the intersection of the bit line 25 and the write word line 26 as shown in FIG. 8 and that, from that arrangement position, an end of the free layer extended portion 40 integrally provided to the free layer 32 is located at the intersection of the bit line 25 and the write word line 26 in a non-contact condition. In this way, by locating only the free layer extended portion 40 of the free layer 32 at the intersection of the bit line 25 and the write word line 26, distances from the bit line 25 and the write word line 26 to the free layer 32 can be shortened.

Figure 1:
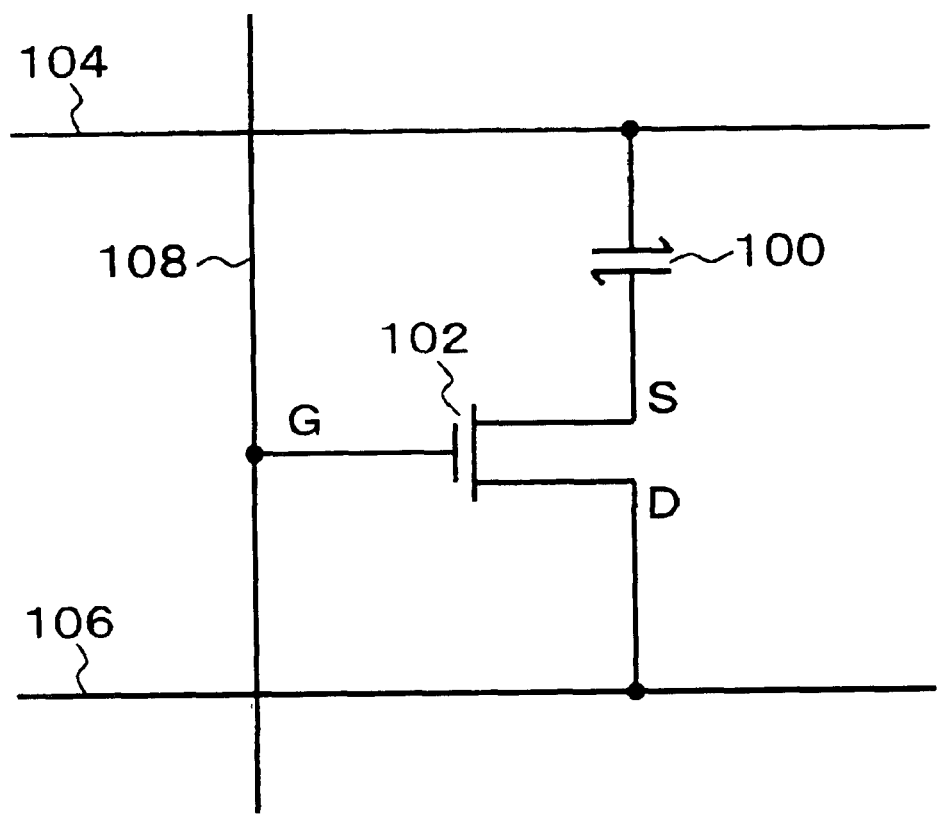
FIG. 1 is a cell circuit diagram of a magnetoresistive memory apparatus.
Figure 2:
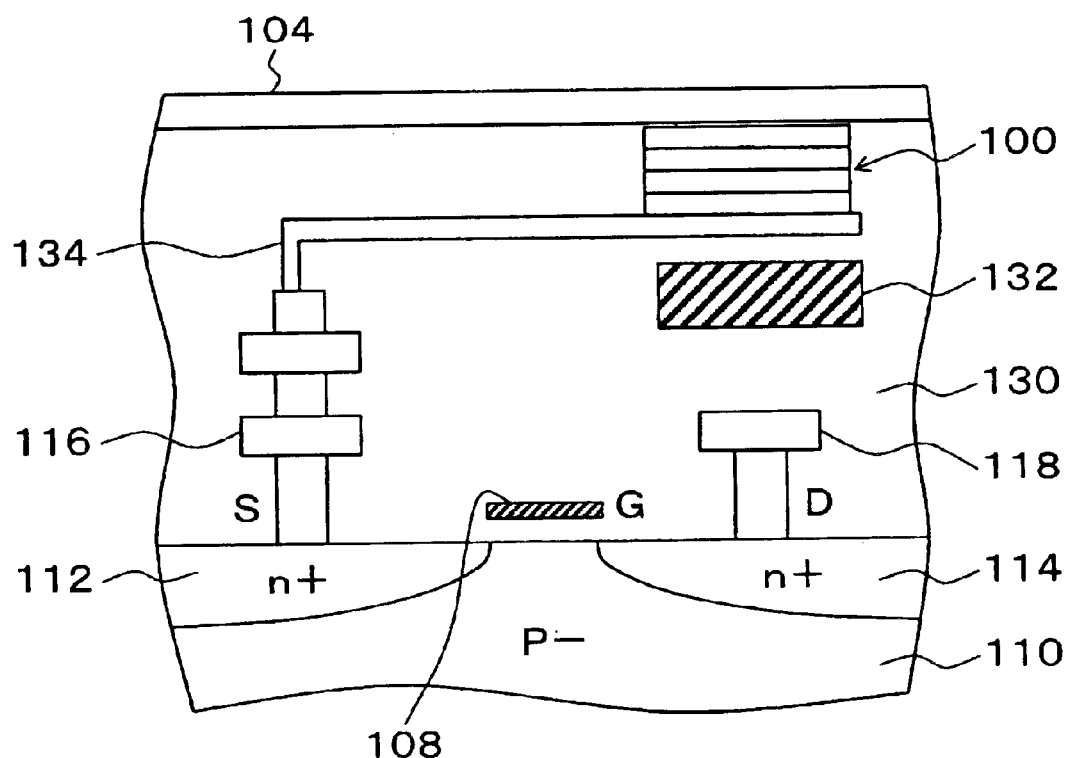
FIG. 2 is a cross sectional view of a cell structure in a conventional magnetoresistive memory apparatus.
Figure 3:
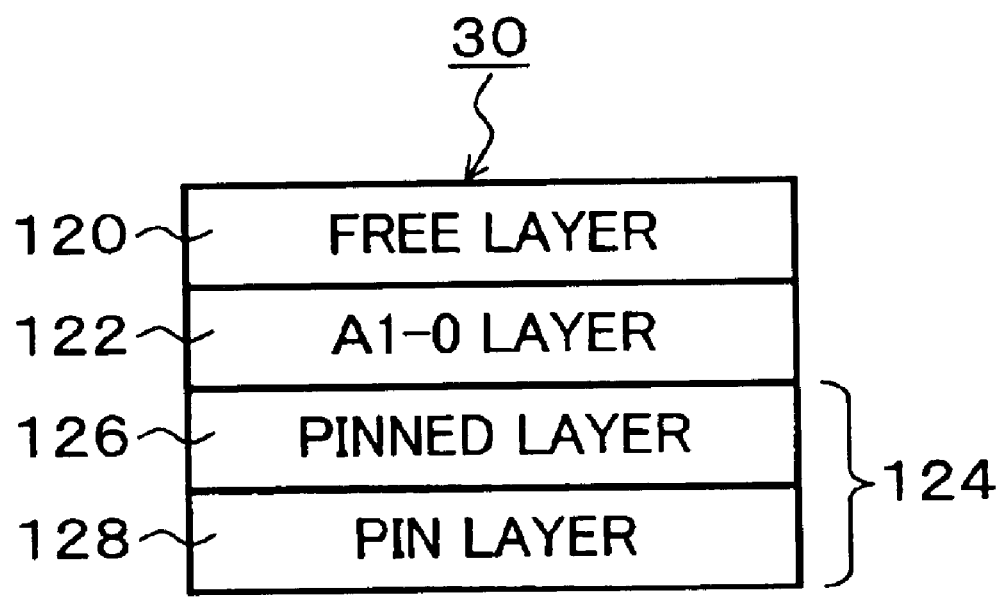
FIG. 3 is a structure explanatory diagram of a magnetic tunnel junction device (MTJ) used in FIG. 2.
Figure 4:
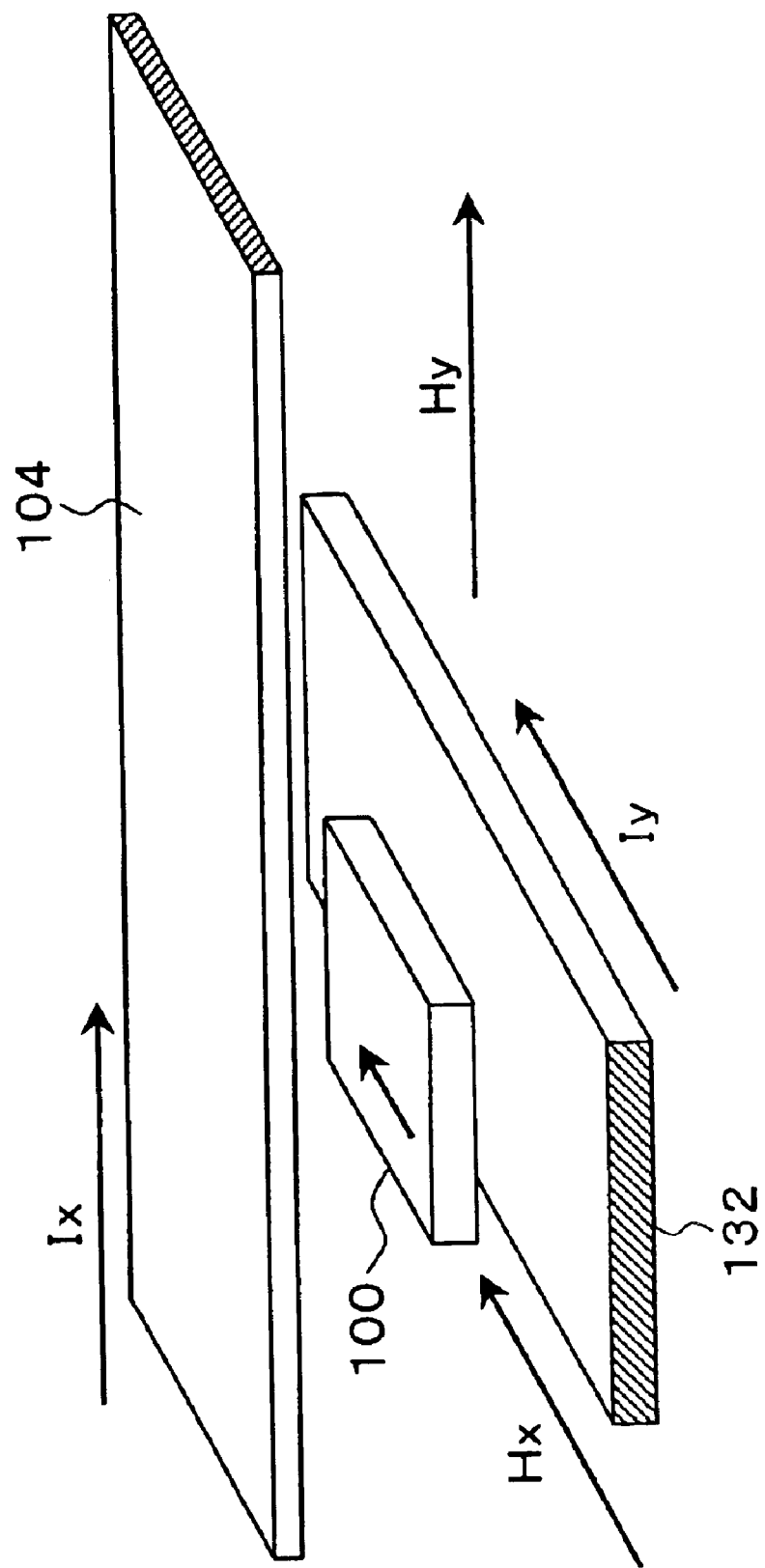
FIG. 4 is an explanatory diagram of a write method for magnetized information to the free layer.
Figure 5:
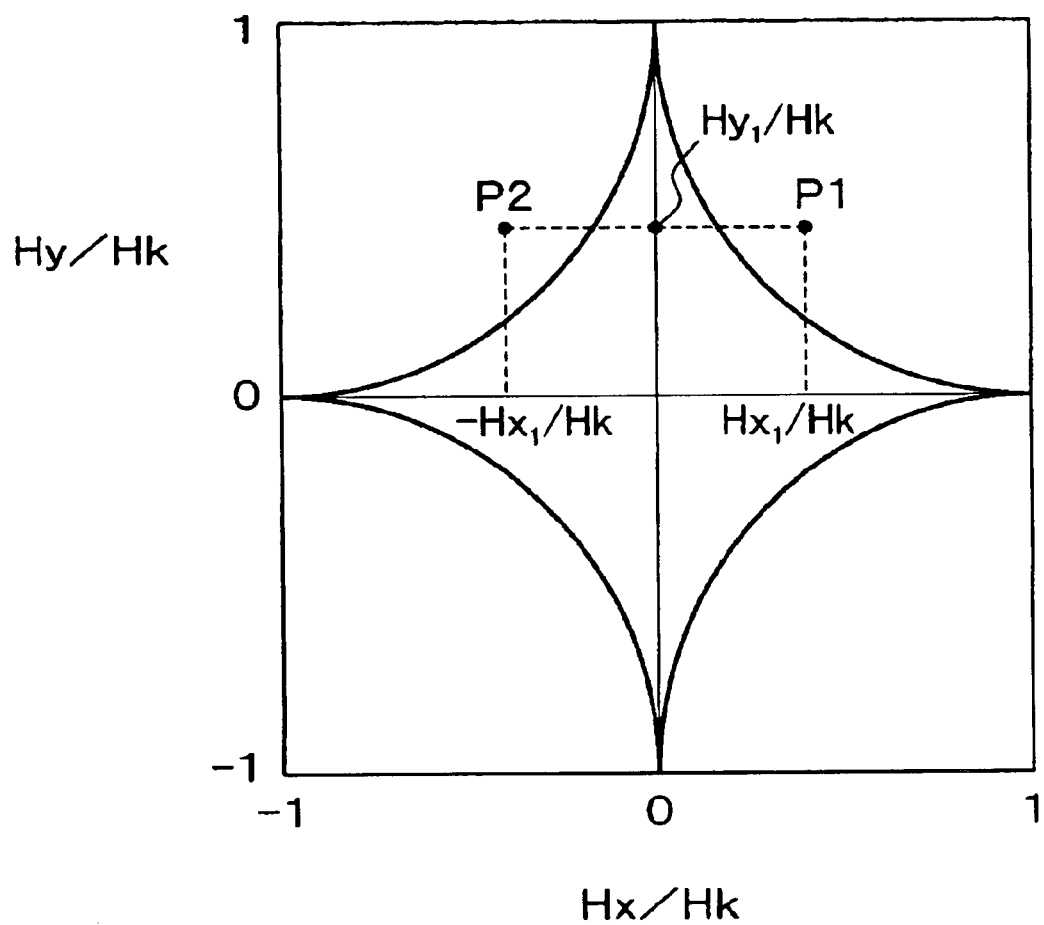
FIG. 5 is an explanatory diagram of an asteroid curve providing thresholds of an easy direction and a hard direction needed for reversal of a magnetization direction of the free layer in the write method of FIG. 4.
Figure 6:
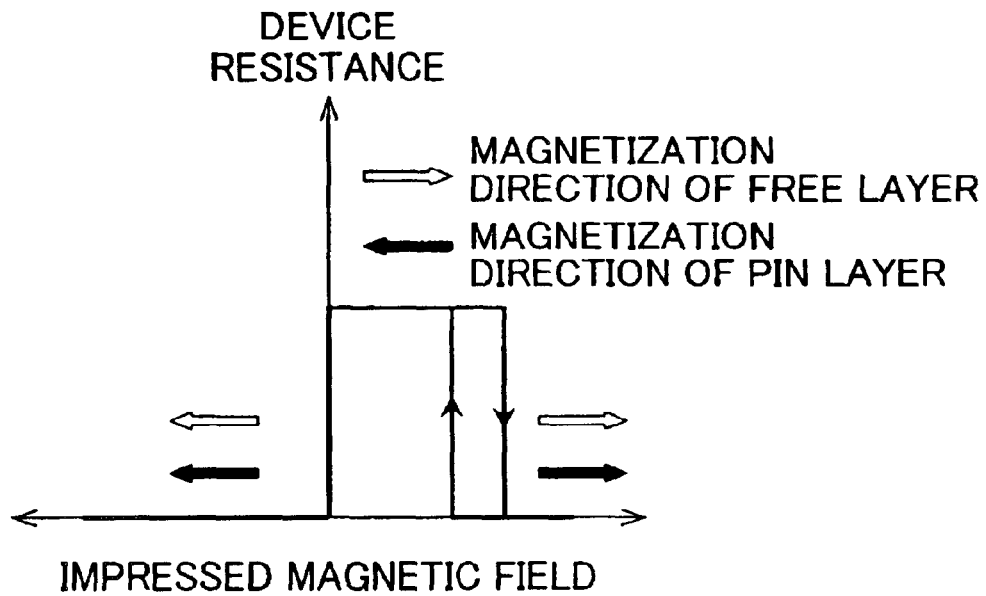
FIG. 6 is a characteristic diagram of a magnetoresistive curve (MR curve) obtained by a magnetic tunnel effect of a magnetic tunnel junction.
Figure 7:
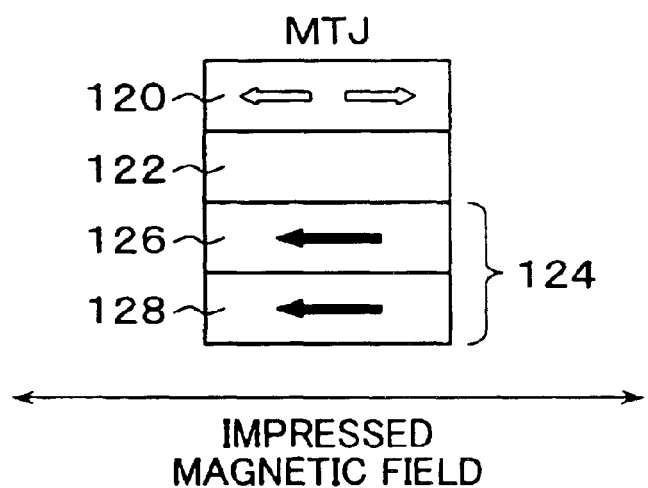
FIG. 7 is an explanatory diagram of a spin-valve structure achieving a ferromagnetic tunnel junction.

The magnetic tunnel junction device 30 of FIG. 8 is referred to as so-called bottom MTJ, since the free layer 32 is located to the upper layer side, on which the bit line 25 is provided, and the insulating layer 34, the pinned layer 36 and the pin layer 38 is formed under the free layer 32. In the case of the magnetic tunnel junction device 30 which has this bottom MTJ structure, if the magnetic tunnel junction device 30 is provided between the bit line 104 and the write word line 132 like the case of a conventional structure in FIG. 2, an interval between the write word line 132 and the free layer 32 must have a distance corresponding to a thickness d1 of the laminated portion of the insulating layer 34, the pinned layer 36 and the pin layer 38, but in the embodiment of FIG. 8, since only the free layer extended portion 40 of the free layer 32 is positioned at the intersection of the bit line 25 and the write word line 26, the interval between the write word line 26 and the free layer extended portion 40 can be shortened for the laminated thickness d1 of the insulating layer 34, the pinned layer 36 and the pin layer 38 in the case of this bottom MTJ. In this way, if the interval of the cross point between the bit line 25 and the write word line 26 can be shortened, when electric currents are sent to each wiring, the intensity of the magnetic field applied to the free layer extended portion 40 can be enhanced by the shortened distance. Actually, since the intensity of the magnetic field applied to the free layer extended portion 40 for reversing the magnetization direction of the free layer 32 is determined by intensities Hx1 and Hy1 of the magnetic fields for which points P1 and P2 exceeding thresholds of the asteroid curve shown in FIG. 5 are operating points, the currents sent to the bit line 25 and the write word line 26 can be reduced by shortening intervals for each wiring. In this embodiment of FIG. 8, because the interval from the write word line 26 to the free layer extended portion 40 has been shortened, a write current Iy sent to the write word line 26 can be reduced by that amount.

Figure 10:
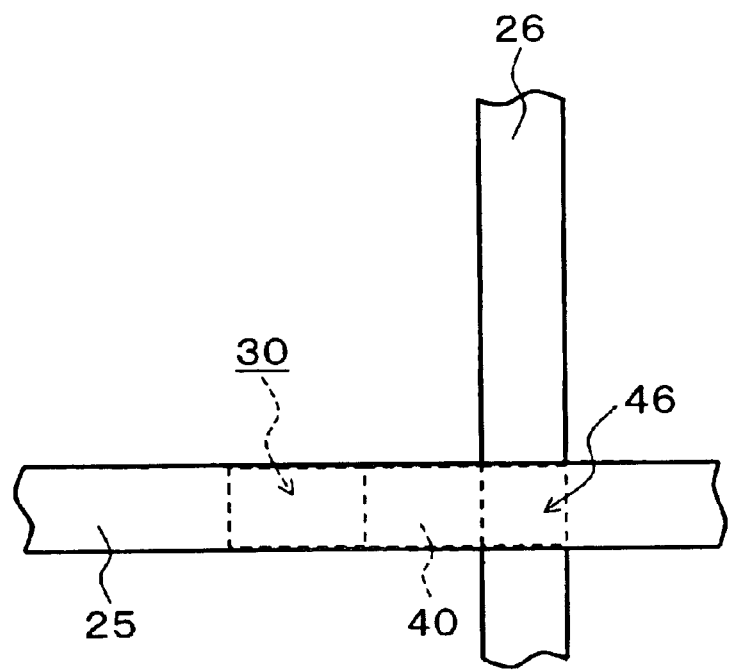
FIG. 10 is an explanatory diagram of the cell structure of FIG. 8 viewed from the plane.

FIG. 10 is a plane view of the cell structure of one (1) cell of the magnetoresistive memory apparatus 10 in FIG. 8 and clarifies the positional relationship of the magnetic tunnel junction device 30 to the intersection 46 due to the matrix arrangement of the bit line 25 and the write word line 26. At this point, a device body portion of the magnetic tunnel junction device 30 is located at the position which is on the lower layer side, along the bit line 25 and deviated from the intersection 46, and from this position which is deviated from the intersection 46 and along the bit line 25, the end of the free layer extended portion 40 integrally formed with the free layer 32 is positioned at the intersection 46.

Figure 11:
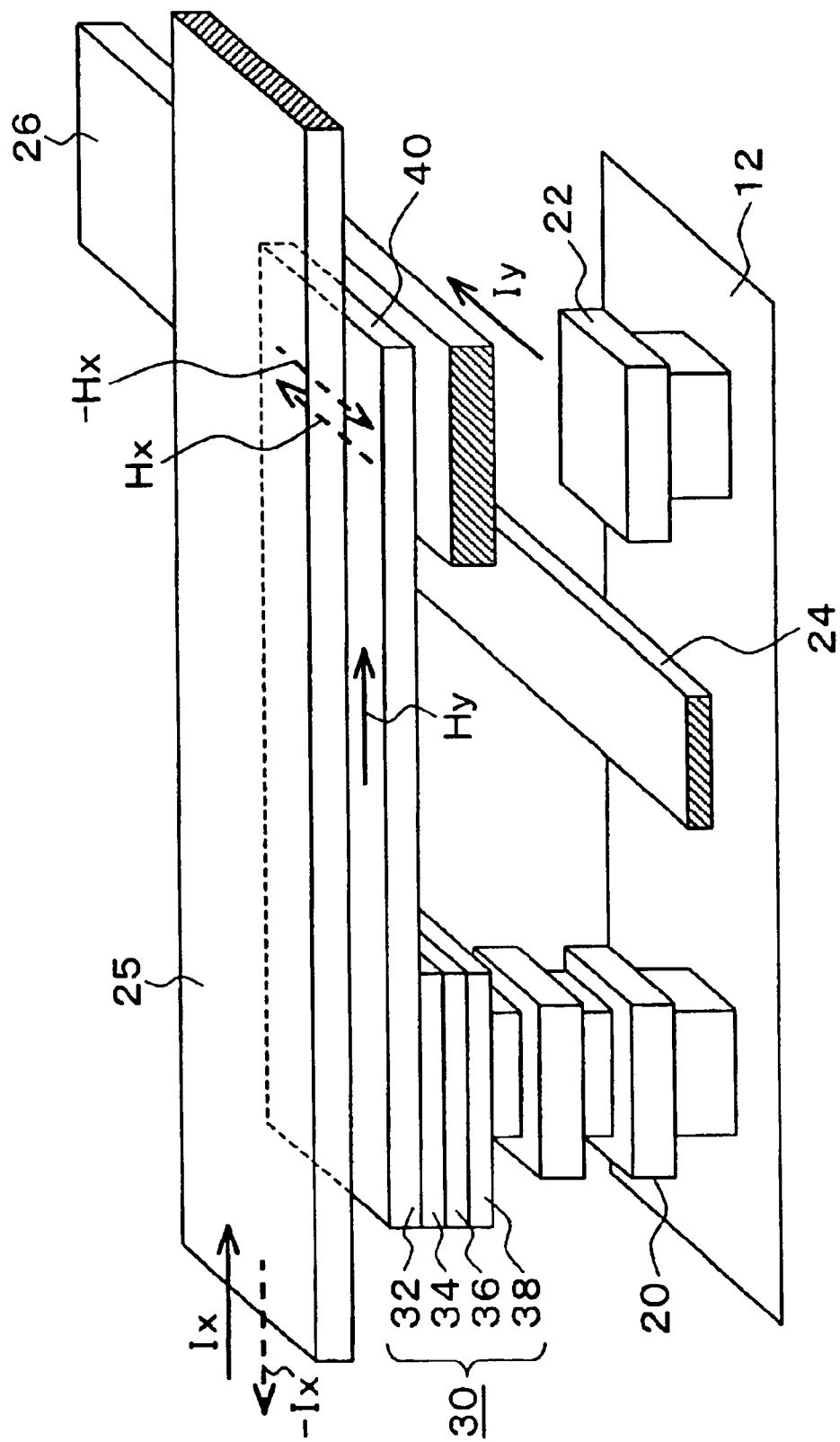
FIG. 11 is an explanatory diagram illustrating the cell structure of FIG. 8 in three dimensions.

FIG. 11 is an explanatory diagram three-dimensionally illustrating the cell structure of one (1) cell of the magnetoresistive memory apparatus 10 in FIG. 8. Of course, this cell structure is embedded in the inter-layer insulating film 18 formed on the semiconductor substrate 12, but is illustrated in exposed state in order to clarify the structure. In FIG. 11, on the semiconductor substrate 12, the source electrode 20 and the drain electrode 22 are provided, and the read word line 24 is also positioned in close vicinity to the gate area without contact. At the upper part of the semiconductor substrate 12, a matrix is constructed by intersecting the write word line 26 and the bit line 25. To the position which is deviated from this intersection of the bit line 25 and the write word line 26 and along the bit line 25, the magnetic tunnel junction device 30 connected to the source electrode 20 is provided. In the magnetic tunnel junction device 30, the free layer 32, the insulating layer 34, the pinned layer 36 and the pin layer 38 are laminated from the upper layer side on which the bit line 25 is located, and among these, the free layer 32 on top is integrally equipped with the free layer extended portion 40, and the end of the free layer extended portion 40 is located at the intersection between the bit line 25 and the write word line 26 without contact.

Next, for the embodiments of FIG. 8 to FIG. 11, a writing operation and a reading operation is described. In the writing of magnetized information to the magnetic tunnel junction device 30, electric currents Ix and Iy is simultaneously sent to two (2) lines, the bit line 25 and the write word line 26, which are orthogonal to each other above and under the free layer extended portion 40, and thereby the magnetized information is written with a synthetic magnetic field of magnetic fields Hx and Hy applied to the free layer 32 which is integrally equipped with the free layer 32 extended portion 40. In other words, by the write current Iy of the write word line 26, the energy barrier necessary for rotation of the magnetization direction is lowered in the free layer 32 comprising the free layer extended portion 40. At this point of time, if the write current Ix is simultaneously sent to the bit line 25 to apply the magnetic field Hx to the easy direction of the free layer 32 comprising the free layer extended portion 40, the magnetization direction of the free layer 32 is turned to the easy direction same as the magnetic fields Hx, and this magnetized condition is set to bit 1, for example. After turning the magnetization direction to the easy direction of the free layer 32 and recording the magnetized information, in order to turn the magnetization direction to the opposite direction, in the state that the write current Iy is sent to the write word line 26 to apply the magnetic field Hy to the hard direction of the free layer 32, the energy consumption necessary for rotation of the magnetization direction is reduced, and at this point, if the write current −Ix to the opposite direction is simultaneously sent to the bit line 25 to apply the magnetic field −Hx to the opposite easy direction of the free layer 32, the magnetization direction of the free layer 32 is turned to the 180 degree-turned easy direction same as the magnetic fields −Hx, and this magnetized condition is set to bit 0.

Then the reading operation is described. In the readout of the magnetic tunnel junction device 30, by applying voltage to the bit line 25 and the read word line 24 to selectively turn on the MOS field-effect transistor 102, a current path from the bit line 25 to the source electrode 20 via the magnetic tunnel junction device 30 is generated, and at this point, resistance of the magnetic tunnel junction device 30 is read out by the flowing current. At this point, in the magnetic tunnel junction device 30, in the case that the free layer 32 is reversed from the magnetized direction of the fixed magnetization layer which consists of the pinned layer 36 and the pin layer 38 by the ferromagnetic tunnel effect, a resistance difference will be about 30 to 50%. In this way, when the current path for readout is generated in the magnetic tunnel junction device 30, the tunnel resistance (tunnel provability) in the magnetic tunnel junction depends on the magnetization conditions of magnetic layer on both sides, and when the angles of the magnetization directions of the free layer 32 and the fixed layer which consists of the pinned layer 36 and the pin layer 38 are the same (θ=0), the tunnel resistance becomes smaller, and when the magnetization directions of the magnetization layers on both sides are opposite (θ=180 degree), the tunnel resistance becomes larger. At this point, among the magnetic fields applied to the free layer 32 when the write currents are simultaneously sent to the bit line 25 and the write word line 26 in order to write the magnetized information to the magnetic tunnel junction device 30, the magnetic fields Hx due to the write current Ix of the bit line 25 is applied to the entire free layer 32 including the free layer extended portion 40, because the free layer 32 is located along the bit line 25. On the other hand, the magnetic field Hy generated by sending the write current Iy to the write word line 26 has the greatest intensity at the intersection where the free layer extended portion 40 and the write word line 26 are opposed, and the magnetic field Hy applied to the free layer becomes weaker as it departs from the intersection, but since a distance from the magnetic tunnel junction device 30 to the intersection where the end of the free layer extended portion 40 is matched is very short, in terms of the free layer 32 as a whole, the magnetic field Hy due to the write current Iy sent to the write word line 26 can also have substantially the same magnetic field intensity as the case of locating the magnetic tunnel junction device 30 at the intersection. Therefore, even in the case of the free layer 32 comprising the free layer extended portion 40, it is possible to achieve the writing of the magnetized information equivalent to the case of locating the entire device at the cross point, and since only the free layer extended portion 40 is located at the intersection to shorten the interval with the write word line 26, the write current Iy sent to the write word line 26 can be reduced by that amount.

Figure 12:
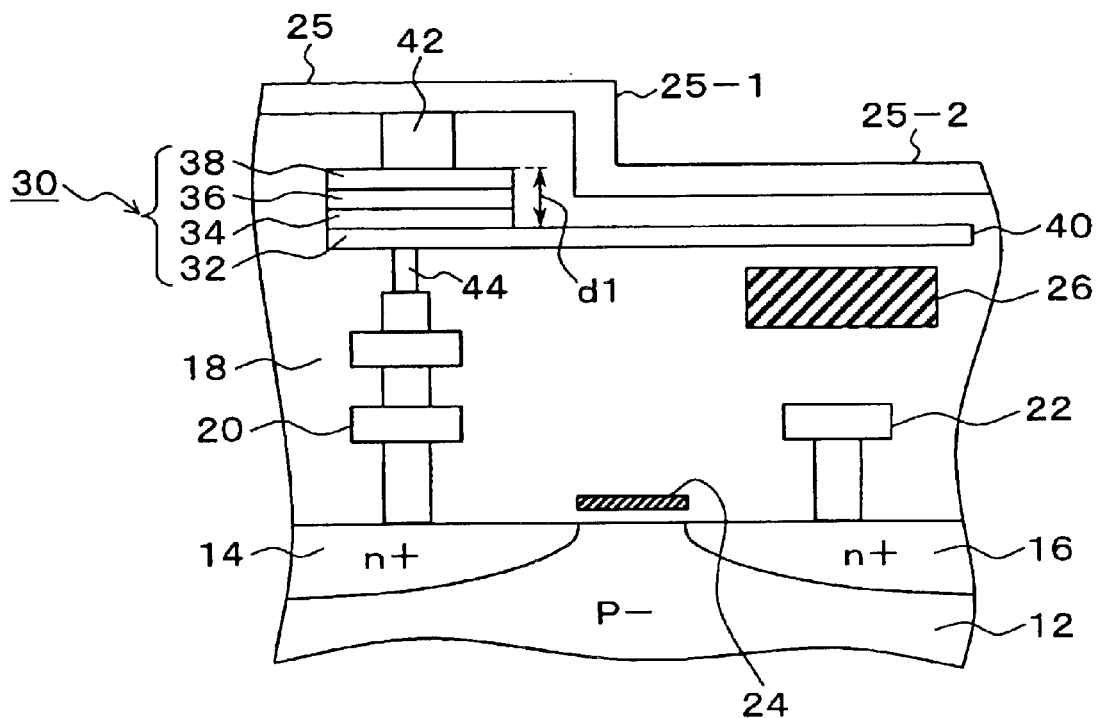
FIG. 12 is a cross sectional view illustrating another embodiment of a cell structure in the magnetoresistive memory apparatus of the present invention.
Figure 13:
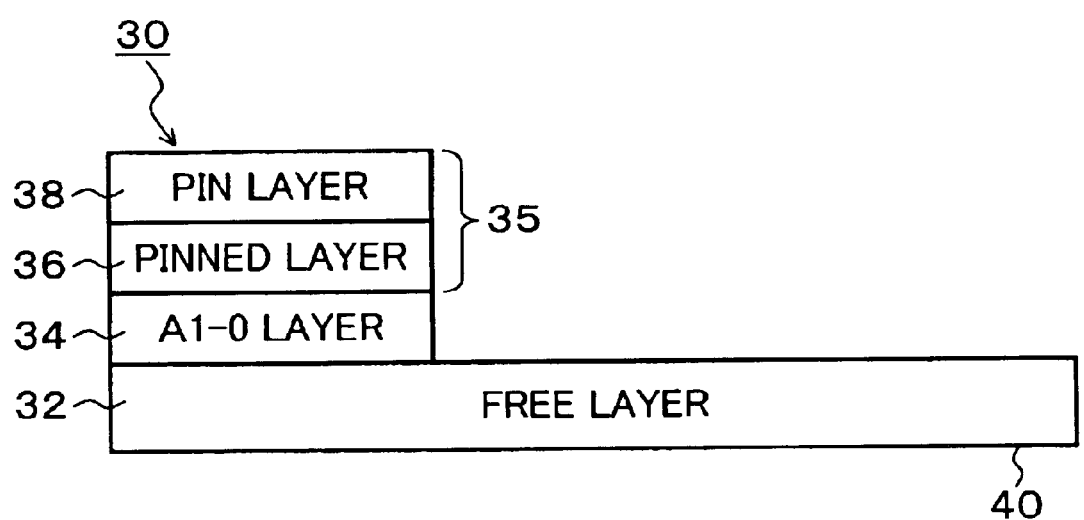
FIG. 13 is a structure explanatory diagram of the magnetic tunnel junction device (MTJ) used in FIG. 12.

FIG. 12 is a cross sectional view of another embodiment of the cell structure in the magnetoresistive memory apparatus of the present invention. The embodiment of FIG. 12 is wherein so-called top MTJ laminated structure is used as the structure of the magnetic tunnel junction device 30, wherein the free layer 32 is located on the lower layer side, and the insulating layer 34, the pinned layer 36 and the pin layer 38 are sequentially laminated on that. Also in the case of the magnetic tunnel junction device 30 which has this top MTJ structure, in the inter-layer insulating layer 1B on the semiconductor substrate 12, the magnetic tunnel junction device 30 in which the free layer 32 is located on the lower layer side is provided and connected to the source electrode 20 and the conductor layer 44, and the bit line 25 and the write word line 26 are located above and under this magnetic tunnel junction device 30 to intersect and constitute a matrix. As taken out and shown in FIG. 13, in the magnetic tunnel junction device 30, the lower layer side is defined as the free layer 32, on which the insulating layer 34, the pinned layer 36 and the pin layer 38 are laminated, and the pinned layer 36 and the pin layer 38 constitute the fixed magnetization layer 35 in which the magnetization direction is fixed. Also, in the free layer 32, the free layer extended portion 40 is integrally formed. In such a magnetic tunnel junction device 30 comprising the free layer extended portion 40, the free layer extended portion 40 extended from the free layer 32 is located at the intersection between the write word line 26 and the bit line 25 without contact. In the case of the magnetic tunnel junction device 30 which has the top MTJ structure, a gap between the free layer extended portion 40 and the write word line 26 is determined uniquely, but the bit line 25 has a structure in which a downward step 25-1 of the bit line 25 is formed at a position where a body portion of the junction device is passed such that a bit line intersection 25-2 comes close to the free layer extended portion 40. In this way, by integrally providing the free layer extended portion 40 to the free layer 32 of the magnetic tunnel junction device 30, locating its end at the intersection of the bit line 25 and the magnetic tunnel junction device 30 without contact and simultaneously bringing the bit line 25 close to the free layer extended portion 40 with the downward step 25-1 at the position where the junction device body is passed, an interval between the bit line 25 and the free layer extended portion 40 can be reduced to the minimum requirement. Therefore, in the case of the magnetic tunnel junction device 30 which has the top MTJ structure, the interval between the write word line 26 and the free layer 32 comprising the free layer extended portion 40 is the same as before, but by providing the free layer extended portion 40 integrated with the free layer 32 and locating it at the intersection, the interval between the bit line 25 located on the upper layer side and the free layer 32 comprising the free layer extended portion 40 can be shortened by, for example, a thickness d1 of the insulating layer 34, the pinned layer 36 and the pin layer 38 in the magnetic tunnel junction device 30 except the free layer 32, and by shortening the interval with the bit line 25, a magnetic field generated by a write current sent to the bit line 25 are efficiently applied to the free layer 32, and since the intensity of the magnetic field necessary for reversing the magnetization direction of the free layer 32 may be constant, the write current sent to the bit line 25 can be reduced by shortened interval with the bit line 25. This operation, in which the write current can be reduced be defining the interval from the bit line 25 to the free layer 32, is effective in the case the write current is needed to increase because the holding power of the free layer 32 is increased by miniaturizing the magnetic tunnel junction device 30, and if the holding power of the free layer 32 is increased, by shortening the interval with the bit line 25, the efficiency of the magnetic field applied to the write current is enhanced by that amount, and it is possible to turn the magnetization direction of the free layer 32 with weaker write current even if the holding power is increased concurrently with the miniaturization, and since the write current sent to the bit line 25 is reduced, it is possible to certainly prevent troubles such as migrations.

Figure 14:
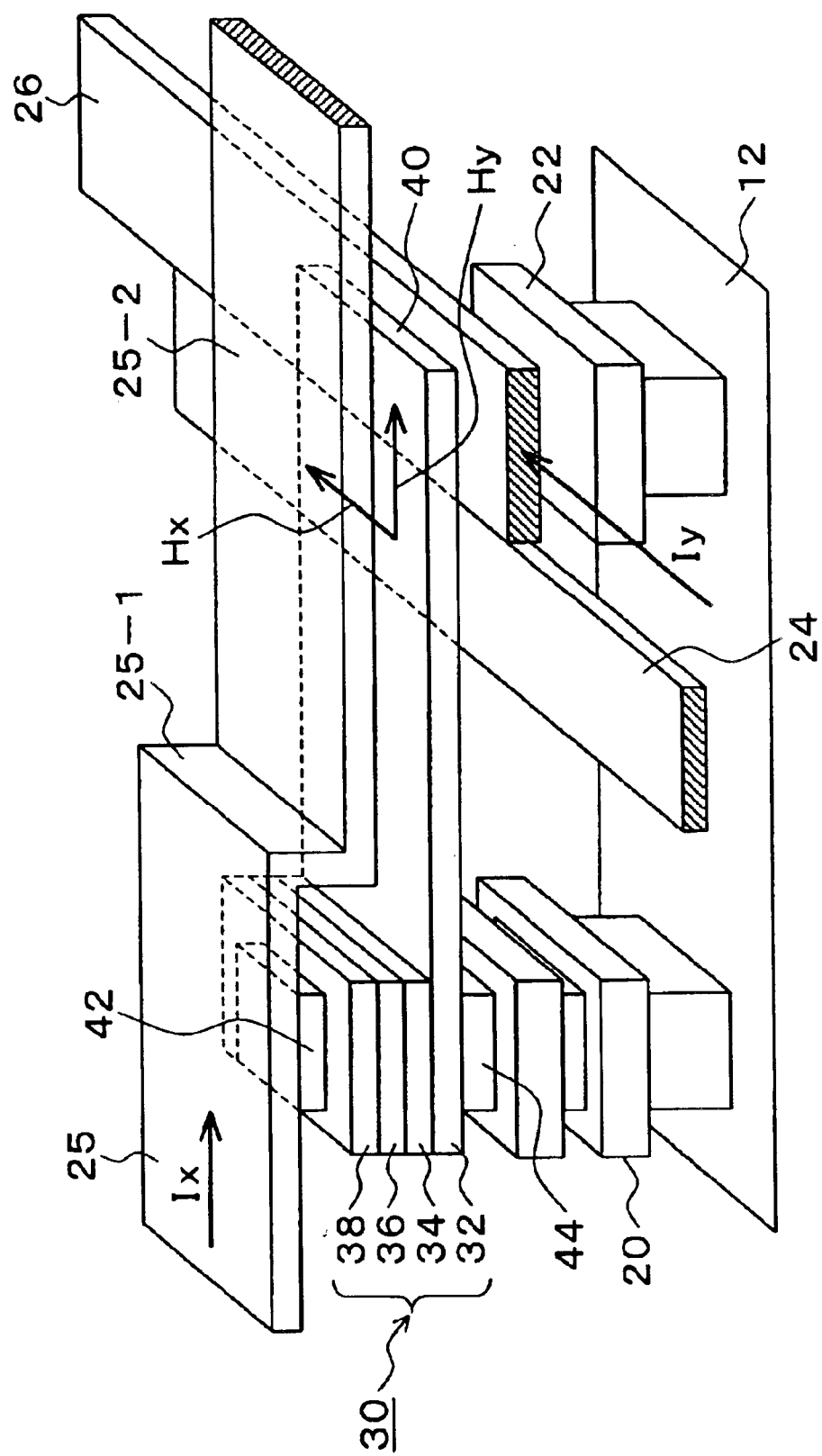
FIG. 14 is an explanatory diagram illustrating the cell structure of FIG. 12 in three dimensions.

FIG. 14 is a three-dimensional structure of the magnetoresistive memory apparatus 10 of the present invention using the magnetic tunnel junction device 30 with the top MTJ structure of FIG. 12. As clarified by this three-dimensional structure of FIG. 14, in the magnetic tunnel junction device 30 located on the semiconductor substrate 12 via the source electrode 20 and the conductor layer 44, the free layer extended portion 40 is integrally provided to the free layer 32, and its end is located at the intersection of the write word line 26 and the bit line 25 without contact, and the bit line 25 is brought close to the free layer extended portion 40 by forming the bit line intersection 25-2 with the downward step 25-1 at the position where the device body of the magnetic tunnel junction device 30 is passed. In this way, with the write current Ix sent to the bit line 25, the magnetic field Hx with the easy direction which is applied to the free layer 32 comprising the free layer extended portion 40 can be efficiently applied, and the write current Ix can be reduced by that amount. It is noted that the writing and reading of the magnetized information to and from the magnetic tunnel junction device 30 in FIG. 14 are basically the same as the embodiments in FIG. 8 to FIG. 11.

Figure 15:
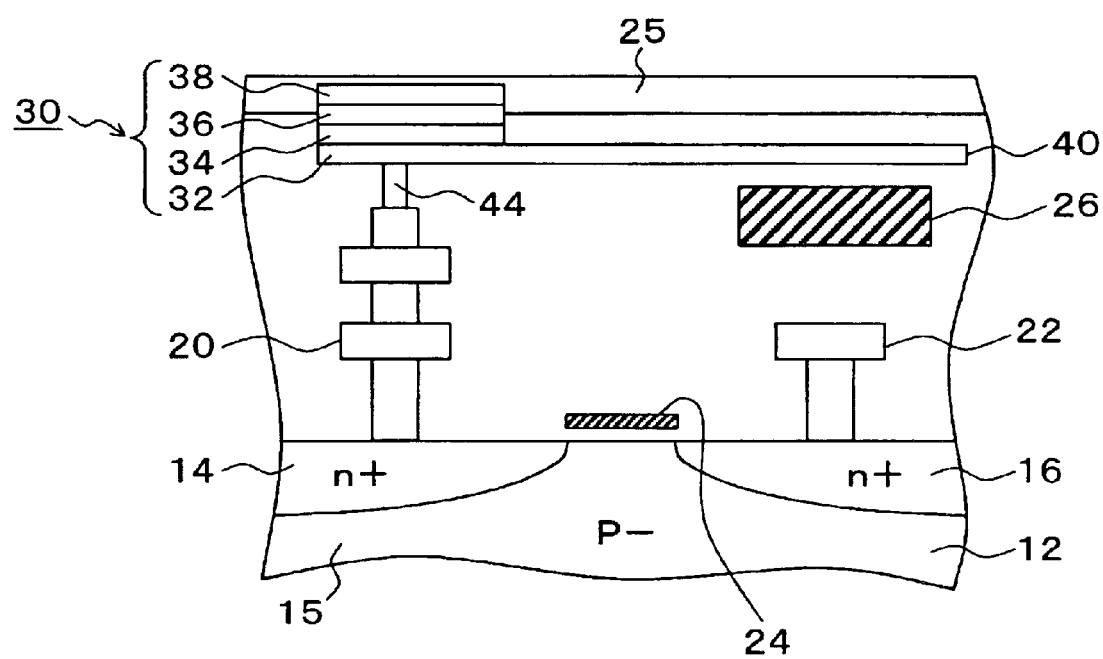
FIG. 15 is a cross sectional view illustrating another embodiment of a cell structure in the magnetoresistive memory apparatus of the present invention.
Figure 16:
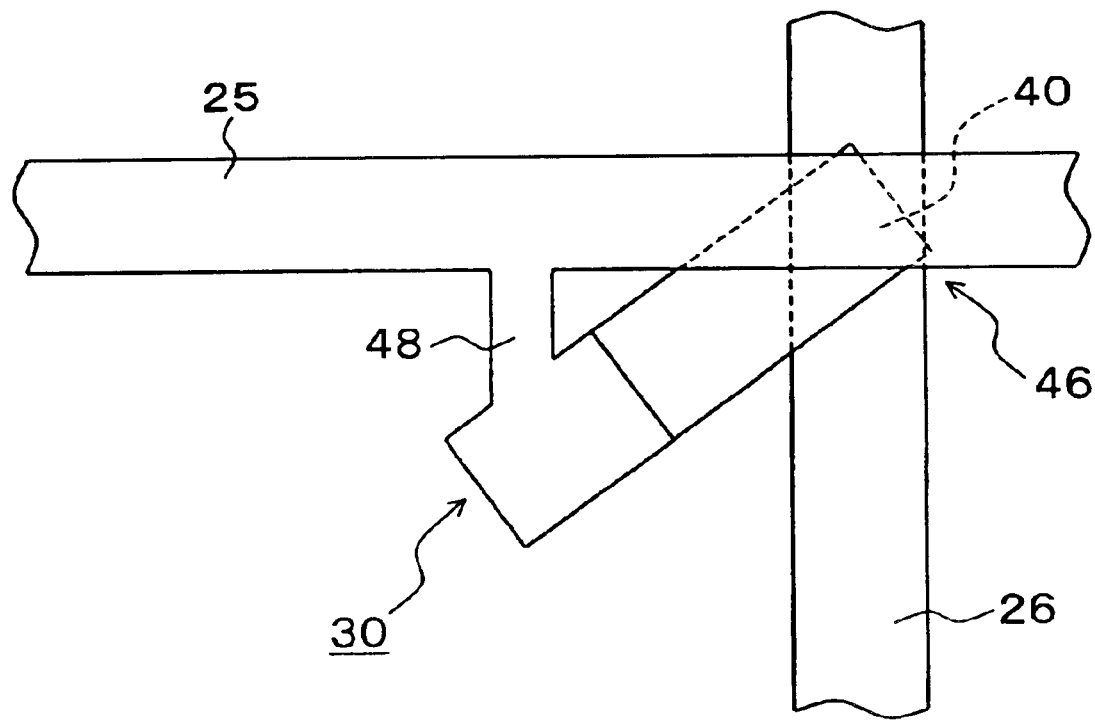
FIG. 16 is a structure explanatory diagram of the magnetic tunnel junction device (MTJ) used in FIG. 15.
Figure 17:
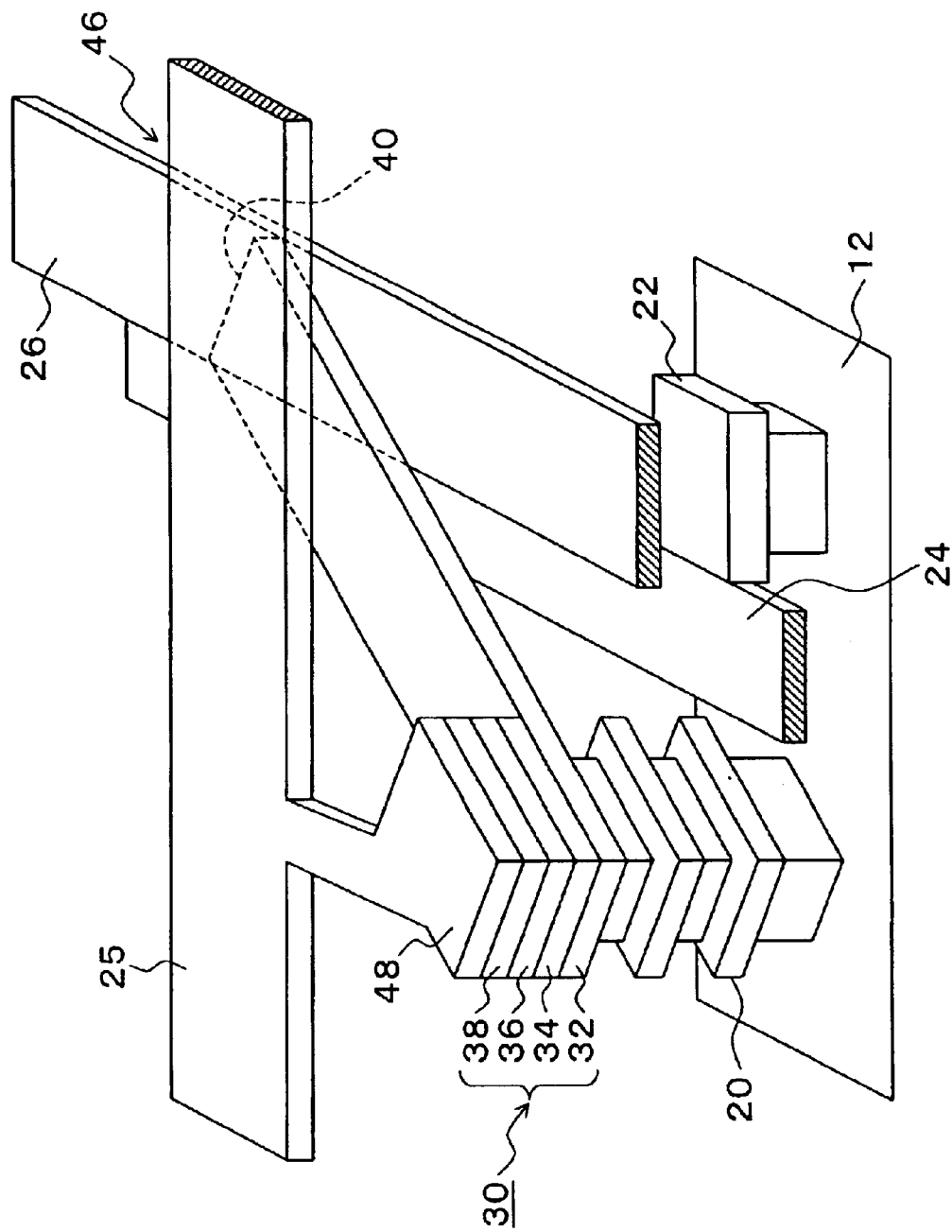
FIG. 17 is an explanatory diagram of the cell structure of FIG. 15 viewed from the plane.

FIG. 15 is a cross sectional view of another embodiment of the cell structure in the magnetoresistive memory apparatus of the present invention; FIG. 16 shows a plane view thereof; and FIG. 17 shows a three-dimensional structure thereof. In FIG. 15, within the inter-layer insulating film 18 formed on the semiconductor substrate 12 in which the MOS field-effect transistor is constructed by the source area 14, the gate area 15 and the drain area 16, the read word line 24 which acts as the gate electrode is located in the vicinity of the gate area 15, and the source area 14 is provided with the source electrode 20, and the drain area 16 is provided with the drain electrode 22. Following the source electrode 20, the magnetic tunnel junction device 30 is provided via the conductor layer 44. The magnetic tunnel junction device 30 is so-called top MTJ structure in which the free layer 32 is on the lower layer side and the insulating layer 34, the pinned layer 36 and the pin layer 38 is formed on that, and the free layer extended portion 40 is integrally provided to the free layer 32, and the end of the free layer extended portion 40 is located without contact at the intersection of the bit line 25 and the write word line 26 which constitutes a matrix.

As clarified in FIG. 16, in this magnetic tunnel junction device 30, the body of the magnetic tunnel junction device 30 is located at a slanted outside position of the intersection 46 of the bit line 25 and the write word line 26, which is away from both lines. And the free layer extended portion 40 integrally provided to the free layer of the magnetic tunnel junction device 30 is located at the intersection 46 from a slanted direction.

Such an arrangement structure of the magnetic tunnel junction device 30 is further clarified by referring to a three-dimensional structure in FIG. 17. In FIG. 17, the magnetic tunnel junction device 30 located on the semiconductor substrate 12 via the source electrode 20 is located at the position deviating from the intersection 46 to the slanted direction, and the free layer extended portion 40 integrally formed with the free layer 32 is located at the intersection 46 from a slanted direction and is electrically connected to the pin layer 38 located on the top of the magnetic tunnel junction device 30 by the conductor layer 48 integrally formed with the bit line 25. In such a magnetoresistive memory apparatus 10 of FIG. 17, the bit line 25, the read word line 24 and the write word line 26 are formed according to design rules of the computer-aided design apparatus (CAD) for semiconductors which has algorithms for vertical and horizontal wirings, but since 45 degree slanted wirings can be accommodated in recent CAD, it is possible to achieve design and fabrication of the magnetic tunnel junction device 30 and the free layer extended portion 40 thereof by using this function for the slanted wiring in CAD. Advantages of this structure in which the magnetic tunnel junction device 30 is located at the position deviating from the bit line 25 and the write word line 26 are that, by locating only the free layer extended portion 40 at the wiring intersection to shorten the interval with the wiring and apply the magnetic fields efficiently to the free layer 32, the write currents can be reduced, and at the same time, by locating the device body of the magnetic tunnel junction device 30 at the position away from the bit line 25 and the write word line 26, effects of the magnet fields due to the write currents can be prevented from being applied to the portion other than the free layer 32, where rotation of the magnetization direction due to the write currents is not needed, to enhance its stability. Also, by locating the magnetic tunnel junction device 30 at the position away from the bit line 25, thinner films can be planned in height direction from the semiconductor substrate 12, comparing to the structure in which the magnetic tunnel junction device 30 is located to the lower layer side of the bit line 25.

Figure 18A:
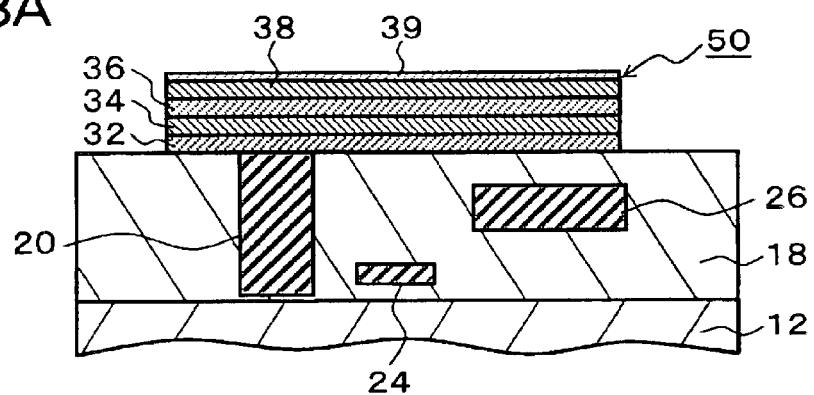
FIGS. 18A to 18C are explanatory diagrams illustrating a method of manufacturing, taking the magnetoresistive memory apparatus of FIG. 12 as an example.
Figure 18B:
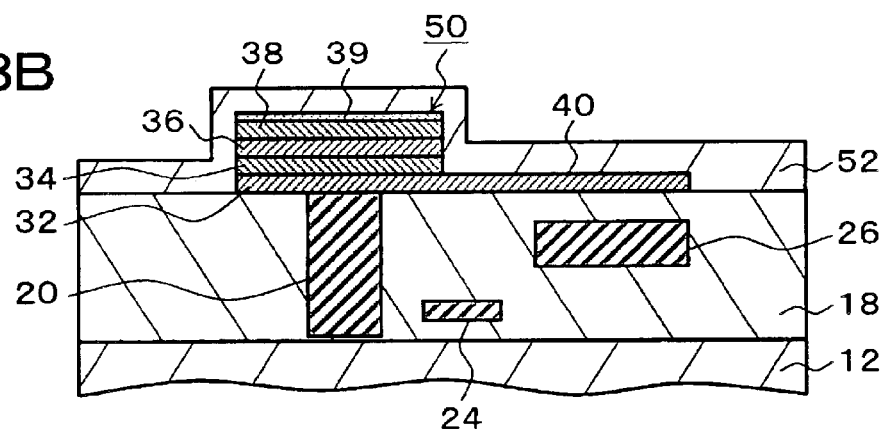
Figure 18C:
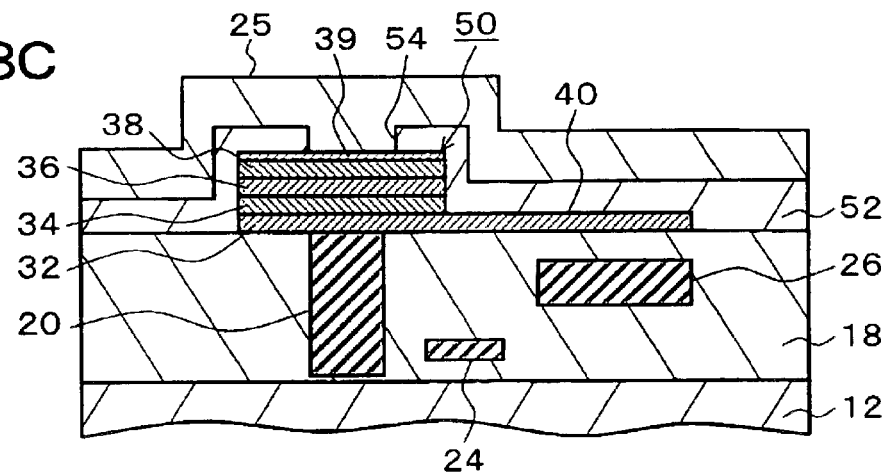

FIGS. 18A to 18C are explanatory diagrams of a method for manufacturing the magnetoresistive memory apparatus 10 of the present invention, and the embodiment using the top MTJ film in FIG. 12 is taken as an example. First, as shown in FIG. 81A, after the source electrode 20, the read word line (gate electrode) 24 and the write word line 26 is provided to the inter-layer insulating film 18 formed on the semiconductor substrate 12 by the use of a damascene method or others, MTJ film 50 comprising the free layer 32, the insulating layer 34, the pinned layer 36, the pin layer 38 and a protective layer 39 is formed on the substrate surface by the use of a sputtering method. At this point, as material for the source electrode 20, the read word line (gate electrode) 24 and the write word line 26, Cu is used, and as material for the inter-layer insulating film 16, alumina is used. Also, material for the free layer 32 in the MTJ film 50 is NiFe; the insulating layer 34 is Al—O; the pinned layer 34 is CoFe; the pin layer is PtMn; and for the protective layer 39, Au is used. Further, for the insulating layer 34 in the MTJ film 50, after the free layer 32 is formed, a thin aluminum layer is formed as a film, and then the insulating layer 34 of aluminum oxide Al—O which has a thickness of several angstroms is formed by the use of a radical oxidation method or a plasma oxidation method. After the MTJ film 50 is formed this way, by using a photolithography and ion milling methods, as shown in FIG. 81B, the free layer 32 is left intact, and milling for leaving the device body is performed to the remaining insulating layer 34, pinned layer 36, pin layer 38 and protective layer 39. The portion of the free layer 32 remaining after the milling of the MTJ film 50 constitutes the free layer extended portion 40. Next, the insulating layer 52 using alumina is formed as a film by the sputtering method on the MTJ film 50 after the milling. Then, as shown in FIG. 81B, by reactive ion etching method (RIE) and the others, a contact hole 54 is provided to an upper position opposed to the MTJ film 50 in the insulating layer 52 using alumina, and after that, a Cu film is formed, and subsequently, by using a photolithography and ion milling methods, the bit line 25 is formed. It is noted that the present invention is not limited to above embodiments and can have any suitable arrangement structure as long as the free layer of the magnetic tunnel junction device constituting the MTJ layer is extended to other layer and this extended portion of the free layer is located at the intersection of the bit line and the word line which constitute a matrix. Also, the magnetoresistive memory apparatus of the present invention is used practically as a magnetoresistive random access memory (MRAM). Further, in the magnetoresistive memory apparatus of the present invention, ferromagnetic materials constituting the free layer and the pinned layer of a magnetic tunnel junction device are not limited to the materials of above embodiments and include any suitable material as long as it is an alloy of Ni and Fe, Co or an alloy of Co and Fe. Further, a semi-ferromagnetic material constituting the pin layer may be any alloy of Pt and Mn.

What is claimed is:

1. A magnetoresistive memory apparatus having a semiconductor substrate on which are arranged a plurality of word lines and bit lines which intersect each other in a non-contact manner to constitute a matrix, and a plurality of magnetoresistive memory devices located in the vicinity of each of intersections of the plurality of bit lines and word lines, the magnetoresistive memory devices each consisting, disposed one upon another via insulating layers, of free layers having variable magnetization directions and of fixed magnetization layers having fixed magnetization directions, with magnetized information being written to the magnetoresistive memory device at an intersection selected by magnetization electric currents supplied to the bit lines and the word lines, the magnetized information being read out by detecting the resistance variance of electric currents flowing through the magnetoresistive memory device due to the tunnel effect, wherein the plurality of magnetoresistive memory devices are located at positions deviating from the intersections of the plurality of word lines and bit lines, and wherein between the bit lines and the word lines at each of the intersections are disposed in a non-contact manner free layer extended portions which are extensions from only the free layer magnetic material of each magnetoresistive memory device.

2. The magnetoresistive memory apparatus according to claim 1, wherein the magnetoresistive memory device includes, laminated in sequence from the upper layer having the bit lines arranged thereon, the free layer provided with the free layer extended portion, the insulating layer and the fixed magnetization layer.

3. The magnetoresistive memory apparatus according to claim 1, wherein the magnetoresistive memory device includes, laminated in sequence from the upper layer having the bit lines arranged thereon, the fixed magnetization layer, the insulating layer and the free layer provided with the free layer extended portion.

4. The magnetoresistive memory apparatus according to claim 1, wherein the magnetoresistive memory device is located at a position deviated from the intersection, along the bit lines and toward the lower layer, and wherein an end of the free layer extended portion is extended to the intersection along the bit lines.

5. The magnetoresistive memory apparatus according to claim 4, wherein when the magnetoresistive memory device includes the fixed magnetization layer, the insulating layer and the free layer provided with the free layer extended portion that are laminated in sequence from the upper layer having the bit lines arranged thereon, the bit lines are stepped at a position passing the magnetoresistive memory device in such a manner as to come closer to the free layer extended portions toward the intersections.

6. The magnetoresistive memory apparatus according to claim 1, wherein the magnetoresistive memory device is located at a position deviated from the intersection and not overlapping the bit lines and the word lines, and wherein an end of the free layer extended portion is slantly extended to the intersection.

7. The magnetoresistive memory apparatus according to claim 1, wherein the fixed magnetization layer of the magnetoresistive memory device includes, placed one on-top of the other, a ferromagnetic layer (pinned layer) and an anti-ferromagnetic layer (pin layer) which are exchange coupled with each other.

8. The magnetoresistive memory apparatus according to claim 7, wherein the free layer and the free layer extended portion of the magnetoresistive memory device are made of an alloy of Ni and Fe, Co or an alloy of Co and Fe, wherein the insulating layer is made of aluminum oxide, wherein the ferromagnetic material layer (pinned layer) of the fixed magnetization layer is made of an alloy of Ni and Fe, Co or an alloy of Co and Fe, and wherein the anti-ferromagnetic material layer (pin layer) is made of an alloy of Pt and Mn.

* * * * *